(12) United States Patent
Obara et al.

(10) Patent No.: US 10,366,964 B2
(45) Date of Patent: Jul. 30, 2019

(54) SEMICONDUCTOR DEVICE HAVING SWITCHING ELEMENTS TO PREVENT OVERCURRENT DAMAGE

(71) Applicant: Mitsubishi Electric Corporation, Tokyo (JP)

(72) Inventors: Taichi Obara, Tokyo (JP); Rei Yoneyama, Tokyo (JP); Masayuki Ando, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/959,350

(22) Filed: Apr. 23, 2018

(65) Prior Publication Data

US 2019/0123012 A1   Apr. 25, 2019

(30) Foreign Application Priority Data

Oct. 23, 2017   (JP) .................................. 2017-204672

(51) Int. Cl.
*H03K 17/081*   (2006.01)
*H01L 23/00*   (2006.01)

(52) U.S. Cl.
CPC .............. *H01L 24/49* (2013.01); *H01L 24/09* (2013.01); *H03K 17/08104* (2013.01)

(58) Field of Classification Search
None
See application file for complete search history.

(56) References Cited

U.S. PATENT DOCUMENTS

| 4,008,484 | A * | 2/1977 | Maekawa | H01L 21/00 257/581 |
| 6,323,717 | B1 * | 11/2001 | Omura | H03K 17/12 327/403 |
| 6,570,185 | B1 * | 5/2003 | Tan | H01L 29/0619 257/77 |
| 6,946,720 | B2 * | 9/2005 | Beasom | H01L 27/0658 257/197 |
| 9,362,205 | B2 * | 6/2016 | Shibasaki | H01L 23/049 |
| 9,363,894 | B2 * | 6/2016 | Shibasaki | H01L 23/049 |
| 2007/0195563 | A1 * | 8/2007 | Shiraishi | H01L 24/49 363/25 |
| 2010/0117570 | A1 * | 5/2010 | Nishimori | H02M 7/003 318/400.3 |

(Continued)

FOREIGN PATENT DOCUMENTS

JP   2013-239697 A   11/2013

*Primary Examiner* — Thomas J. Hiltunen
(74) *Attorney, Agent, or Firm* — Studebaker & Brackett PC (57) ABSTRACT

A semiconductor device including a first semiconductor switching element having a first gate pad, a plurality of first emitter pads, and a first collector pad, a first wire for connecting adjacent pads out of the plurality of first emitter pads, a first output wire for connecting one of the plurality of first emitter pads to an output, a first controller for applying a gate voltage to the first gate pad, a first emitter wire that is directly connected to a first extraction pad which is any one pad of the plurality of first emitter pads, and is connected to the first controller to give a ground potential of the first controller, and a second semiconductor switching element having a second gate pad, a second emitter pad and a second collector pad connected to the output.

15 Claims, 7 Drawing Sheets

(56) References Cited

U.S. PATENT DOCUMENTS

| | | | |
|---|---|---|---|
| 2012/0153719 A1* | 6/2012 | Inaba | B60L 3/003 307/10.1 |
| 2013/0175704 A1* | 7/2013 | Jeun | H01L 21/56 257/777 |
| 2015/0222202 A1* | 8/2015 | Cyr | H03K 17/0828 363/131 |
| 2016/0043711 A1* | 2/2016 | Cyr | H02M 1/32 318/400.22 |

* cited by examiner

SEMICONDUCTOR DEVICE HAVING SWITCHING ELEMENTS TO PREVENT OVERCURRENT DAMAGE

BACKGROUND

Field

The present invention relates to a semiconductor device.

Background Art

Japanese Unexamined Patent Application Publication No. 2013-239697 A discloses a wiring structure in a power module. Specifically, it discloses that a chip resistor serving as an antistatic member for connecting a pair of external lead-out terminals which are a gate terminal and an emitter terminal of an IGBT chip is provided inside a resin case to thereby prevent electrostatic trouble from occurring in a storage or shipping process without using IC foam, which is an antistatic member to be detachably mounted outside the resin case.

For example, in a semiconductor device for treating large current, which is called a power module, an excessively large current occurs in a semiconductor switching element due to steep current variation under an operation of the semiconductor switching element, which may cause the semiconductor switching element to be damaged. Therefore, it is preferable that the emitter of the semiconductor switching element and a controller for controlling the semiconductor switching element are connected to each other via an emitter wire, and the ground potential of the controller is reduced by induced electromotive force under switching of the semiconductor switching element. However, it has been difficult to introduce such a mechanism without any trouble. For example, the size of the semiconductor device is increased or the ground potential of the controller is excessively reduced in some cases.

SUMMARY

The present invention has been implemented to solve the problems as described above, and has an object to provide a semiconductor device capable of preventing damage of a semiconductor switching element without any trouble.

In some examples, a semiconductor device includes a first semiconductor switching element including a first gate pad, a plurality of first emitter pads, and a first collector pad, a first wire for connecting adjacent pads out of the plurality of first emitter pads, a first output wire for connecting one of the plurality of first emitter pads to an output, a first controller for applying a gate voltage to the first gate pad, a first emitter wire that is directly connected to a first extraction pad which is any one pad of the plurality of first emitter pads, and is connected to the first controller to give a ground potential of the first controller, and a second semiconductor switching element including a second gate pad, a second emitter pad and a second collector pad connected to the output.

In some examples, a semiconductor device includes a first semiconductor switching element including a first gate pad, a first emitter pad connected to an output, and a first collector pad, a second semiconductor switching element including a second gate pad, a plurality of second emitter pads, an emitter resistor and a second collector pad connected to the output, a wire for connecting adjacent pads out of the plurality of second emitter pads, a second output wire that is connected to one pad out of the plurality of second emitter pads, and makes an emitter current of the second semiconductor switching element flow to an outside of the second semiconductor switching element, a controller for applying a gate voltage to the second gate pad, and an emitter wire that is directly connected to a extraction pad which is any one pad out of the plurality second emitter pads, and connected to the controller to give a ground potential of the controller, wherein the extraction pad and a non-extraction pad which is a pad other than the extraction pad out of the plurality of second emitter pads are connected to each other via the emitter resistor.

Other and further objects, features and advantages of the invention will appear more fully from the following description.

DETAILED DESCRIPTION

Semiconductor devices according to embodiments will be described with reference to the drawings. The same or corresponding constituent elements are represented by same signs, and duplicative descriptions thereof may be omitted.

First Embodiment

Figure 1:
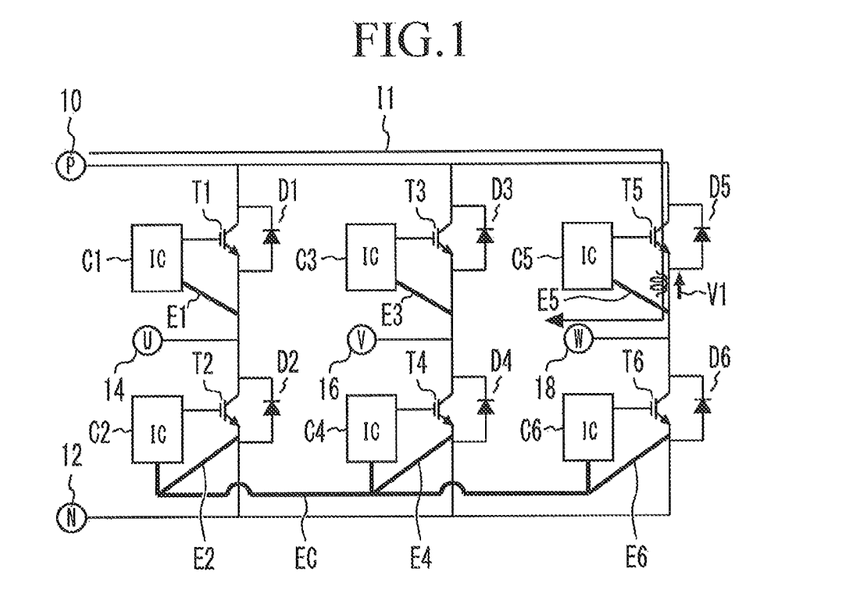
FIG. 1 is a circuit diagram of a semiconductor device according to a first embodiment.

FIG. 1 is a circuit diagram showing a semiconductor device according to a first embodiment. The semiconductor device is a power module constituting a three-phase AC inverter. A circuit including a first semiconductor switching element T1 and a diode D1 which are connected in anti-parallel to each other, and a circuit including a second semiconductor switching element T2 and a diode D2 which are connected in anti-parallel to each other are connected to each other in series to constitute one phase of the inverter circuit. An output U terminal 14 is connected to a middle point between the first semiconductor switching element T1 and the second semiconductor switching element T2.

A circuit including a first semiconductor switching element T3 and a diode D3 which are connected in anti-parallel to each other, and a circuit including a second semiconductor switching element T4 and a diode D4 which are connected in anti-parallel to each other are connected to each other in series to constitute one phase of the inverter circuit. An output V terminal 16 is connected to a middle point between the first semiconductor switching element T3 and the second semiconductor switching element T4.

A circuit including a first semiconductor switching element T5 and a diode D5 which are connected in anti-parallel to each other, and a circuit including a second semiconductor switching element T6 and a diode D6 which are connected in anti-parallel to each other are connected to each other in series to constitute one phase of the inverter circuit. An output W terminal 18 is connected to a middle point between the first semiconductor switching element T5 and the second semiconductor switching element T6.

The collectors of the first semiconductor switching elements T1, T3 and T5 are connected to a P-terminal 10 which is connected to a high-voltage side of a power source. The emitters of the second semiconductor switching elements T2, T4 and T6 are connected to an N-terminal 12 connected to a low-voltage side of the power source.

The first semiconductor switching elements T1, T3 and T5 and the second semiconductor switching elements T2, T4 and T6 are semiconductor chips each having an MOS structure. Each of these semiconductor switching elements may be a MOSFET using SiC as a material thereof or an IGBT using SiC as a material thereof. It is preferable to use a wide bandgap semiconductor having a larger bandgap than silicon as the material of these semiconductor switching elements. For example, SiC, gallium-nitride-based material or diamond is known as the wide bandgap semiconductor. By using the wide bandgap semiconductor, the thermal and electrical characteristics of the elements can be enhanced as compared with a case where silicon is used.

First controllers C1, C3 and C5 are control ICs for applying gate voltages to gate pads of the first semiconductor switching elements T1, T3 and T5, respectively. Second controllers C2, C4 and C6 are control ICs for applying gate voltages to gate pads of the second semiconductor switching elements T2, T4 and T6.

The emitter of the first semiconductor switching element T1 and the first controller C1 are connected to each other via a first emitter wire E1. The induced electromotive force under switching of the first semiconductor switching element T1 reduces the ground potential of the first controller C1 via the first emitter wire E1. That is, inductance is taken into the first controller C1, which causes decrease in gate reference potential of the first controller C1, so that the energization capability of the first semiconductor switching element T1 can be suppressed. Therefore, overcurrent of the first semiconductor switching element T1 can be prevented.

Emitter wires are also connected to the other semiconductor switching elements. Specifically, the emitter of the first semiconductor switching element T3 and the first controller C3 are connected to each other via a first emitter wire E3. Furthermore, the emitter of the first semiconductor switching element T5 and the first controller C5 are connected to each other via a first emitter wire E5. As described above, the ground potentials of the first controllers C1, C3 and C5 are given by the first emitter wires E1, E3 and E5, respectively. Accordingly, the overcurrent of the semiconductor switching elements constituting all the upper arms can be suppressed.

Furthermore, the emitters of the second semiconductor switching elements T2, T4 and T6 constituting the lower arms are also connected to the second controllers C2, C4 and C6 via second emitter wires E2, E4 and E6, respectively. By providing the second emitter wires E2, E4 and E6, the induced electromotive force under switching of the second semiconductor switching elements T2, T4 and T6 reduces the ground potentials of the second controllers C2, C4 and C6 respectively, which causes decrease in gate reference potentials of the second controllers C2, C4 and C6, so that the energization capability of the second semiconductor switching elements T2, T4 and T6 can be suppressed. Therefore, overcurrent of the second semiconductor switching elements T2, T4 and T6 can be prevented.

For example, when current flows along a path of an arrow I1 in FIG. 1, induced electromotive force −V1[V] occurring at the emitter of the first semiconductor switching element T5 reduces the ground potential of the first controller C5.

As shown in FIG. 1, the second emitter wires E2, E4 and E6 are connected to one another via a common wire EC. The second controllers C2, C4 and C6 use the common wire EC as the ground wires. In other words, the ground wires of the second controllers C2, C4 and C6 are common to U, V and W phases.

Figure 2:
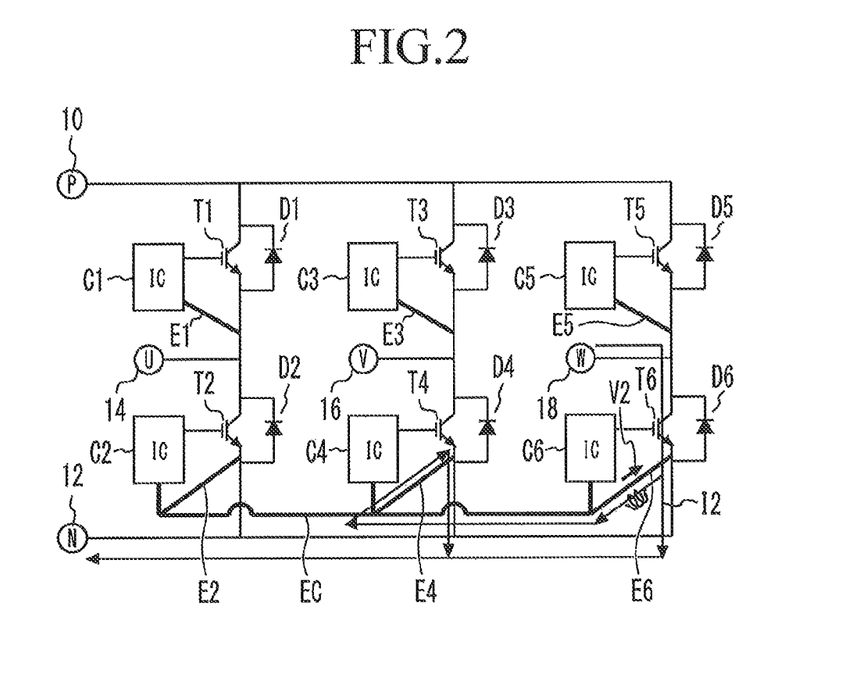
FIG. 2 is a circuit diagram of a semiconductor device according to a first embodiment.

FIG. 2 shows that the ground potential of the second controller C6 decreases when current flows in the second semiconductor switching element T6. An arrow I2 in FIG. 2 indicates that current flows in the second semiconductor switching element T6. At this time, induced electromotive force −V2[V] occurring in the emitter of the second semiconductor switching element T6 reduces the ground potential of the second controller C6. Since the ground wires of the second controllers C2, C4 and C6 are common to one another as described above, induced electromotive force occurring in the second emitter wire E6 of the W phase is added with, for example, induced electromotive force occurring in the second emitter wire E4 of the V phase. Accordingly, it is necessary to take care of excessive decrease of the ground potential of the second controller C6.

Figure 3:
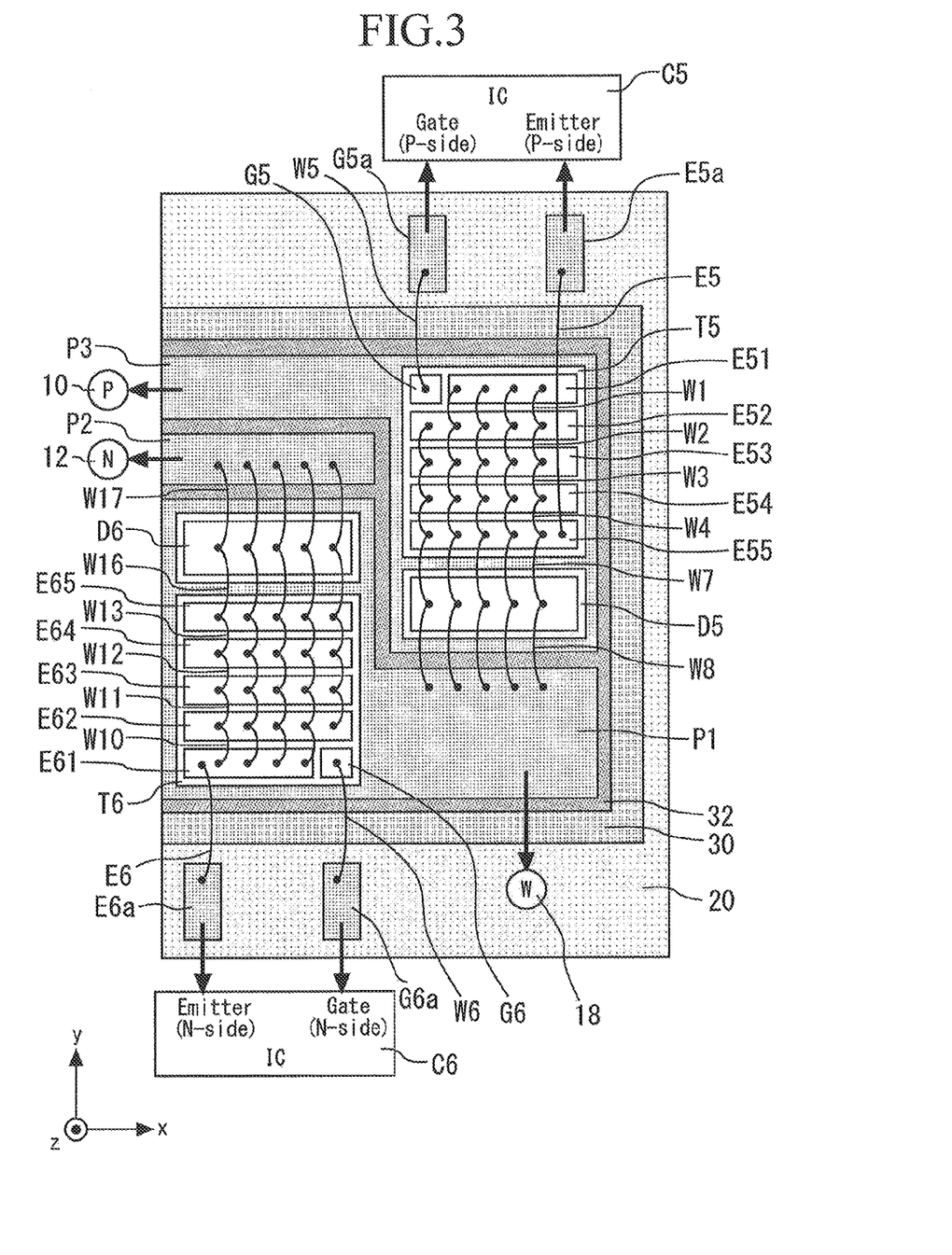
FIG. 3 is a partial plan view of the semiconductor device according to the first embodiment.

FIG. 3 is a partial plan view showing the semiconductor device according to the first embodiment. FIG. 3 mainly shows elements constituting the W phase. For example, a base plate 30 is accommodated in a case 20 formed of resin as a material thereof. An insulating substrate 32 is provided on the base plate 30. The insulating substrate 32 is formed of ceramics, for example. Circuit patterns P1, P2 and P3 are formed on the insulating substrate 32. The circuit patterns P1, P2 and P3 are formed of conductors such as metal thin films, for example.

The output W terminal 18 is fixed to the circuit pattern P1. The N-terminal 12 is fixed to the circuit pattern P2. The P-terminal 10 is fixed to the circuit pattern P3. The second semiconductor switching element T6 and the diode D6 are fixed to the circuit pattern P1, and the first semiconductor switching element T5 and the diode D5 are fixed to the circuit pattern P3. The fixation of these elements may be performed using solder, for example.

The first semiconductor switching element T5 has a first gate pad G5 and first emitter pads E51, E52, E53, E54 and E55 on the front surface thereof, and also has a first collector pad on the back surface thereof. The first collector pad may be fixed to the circuit pattern P3 by solder or an electrically conductive adhesive agent. Accordingly, the first collector pad is connected to the high-voltage side of the power source. Plural first emitter pads are provided to the first semiconductor switching element T5. Each of the first emitter pads E51, E52, E53, E54 and E55 has a slender shape extending in an x-direction. The long sides of these slender pads are adjacent to one another.

Four first wires W1 connect the first emitter pad E51 and the first emitter pad E52. Five first wires W2 connect the first emitter pad E52 and the first emitter pad E53. Five first wires W3 connect the first emitter pad E53 and the first emitter pad E54. Five first wires W4 connect the first emitter pad E54 and the first emitter pad E55. As described above, the first wires W1, W2, W3 and W4 are wires for connecting the adjacent pads out of the first emitter pads E51, E52, E53, E54 and E55.

The first gate pad G5 and a gate terminal G5a are connected to each other via a wire W5. The first emitter pad E55 and an emitter terminal E5a are connected to each other via the first emitter wire E5. The gate terminal G5a and the emitter terminal E5a are connected to the first controller C5. The first controller C5 may be provided outside the case 20, or positioned in a z positive direction of the base plate 30 inside the case 20.

The diode D5 has an anode pad on the front surface thereof, and a cathode pad on the back surface thereof. The cathode pad is connected to the circuit pattern P3 by solder or an electrically conductive adhesive agent. A first output wire W7 connects the first emitter pad E55 and the anode pad of the diode D5. A first output wire W8 connects the anode pad of the diode D5 and the circuit pattern P1. Since the circuit pattern P1 is a pattern to which the output W terminal 18 is fixed, it may be said that the first output wires W7, W8 connect one pad out of the plural first emitter pads and an output. In the first embodiment, it may be said that the first emitter pad E55 out of the plural first emitter pads is connected to the output.

The second semiconductor switching element T6 is configured to have the same specification as the first semiconductor switching element T5. The second semiconductor switching element T6 has a second gate pad G6 and second emitter pads E61, E62, E63, E64 and E65 on the front surface thereof, and also has a second collector pad on the back surface thereof. Since the second collector pad is connected to the circuit pattern P1 by solder or the like, it may be said that the second collector pad is connected to the output. Each of the second emitter pads E61, E62, E63, E64 and E65 has a slender shape extending in the x-direction. The long sides of these slender pads are adjacent to one another.

Four second wires W10 connect the second emitter pad E61 and the second emitter pad E62. Five second wires W11 connect the second emitter pad E62 and the second emitter pad E63. Five second wires W12 connect the second emitter pad E63 and the second emitter pad E64. Five second wires W13 connect the second emitter pad E64 and the second emitter pad E65. As described above, the second wires W10, W11, W12 and W13 are wires for connecting the adjacent pads out of the second emitter pads E61, E62, E63, E64 and E65.

The second gate pad G6 and a gate terminal G6a are connected to each other via the wire W6. The second emitter pad E61 and an emitter terminal E6a are connected to each other via the second emitter wire E6. The gate terminal G6a and the emitter terminal E6a are connected to the second controller C6. The second controller C6 may be provided outside the case 20 or positioned in the z positive direction of the base plate 30 inside the case 20.

The diode D6 has an anode pad on the front surface thereof, and also has a cathode pad on the back surface thereof. The cathode pad is connected to the circuit pattern P1 by solder or the like. A second output wire W16 connects the second emitter pad E65 and the anode pad of the diode D6. A second output wire W17 connects the anode pad of the diode D6 and the circuit pattern P2. Accordingly, the second emitter pad E65 is connected to the low-voltage side of the power source. The second output wires W16, W17 are connected to one pad out of the plural second emitter pads, and provided to make the emitter current of the second semiconductor switching element T6 flow to the outside of the second semiconductor switching element T6. In this embodiment, the second output wires W16, W17 connect the second emitter pad E65 and the circuit pattern P2.

Figure 4:
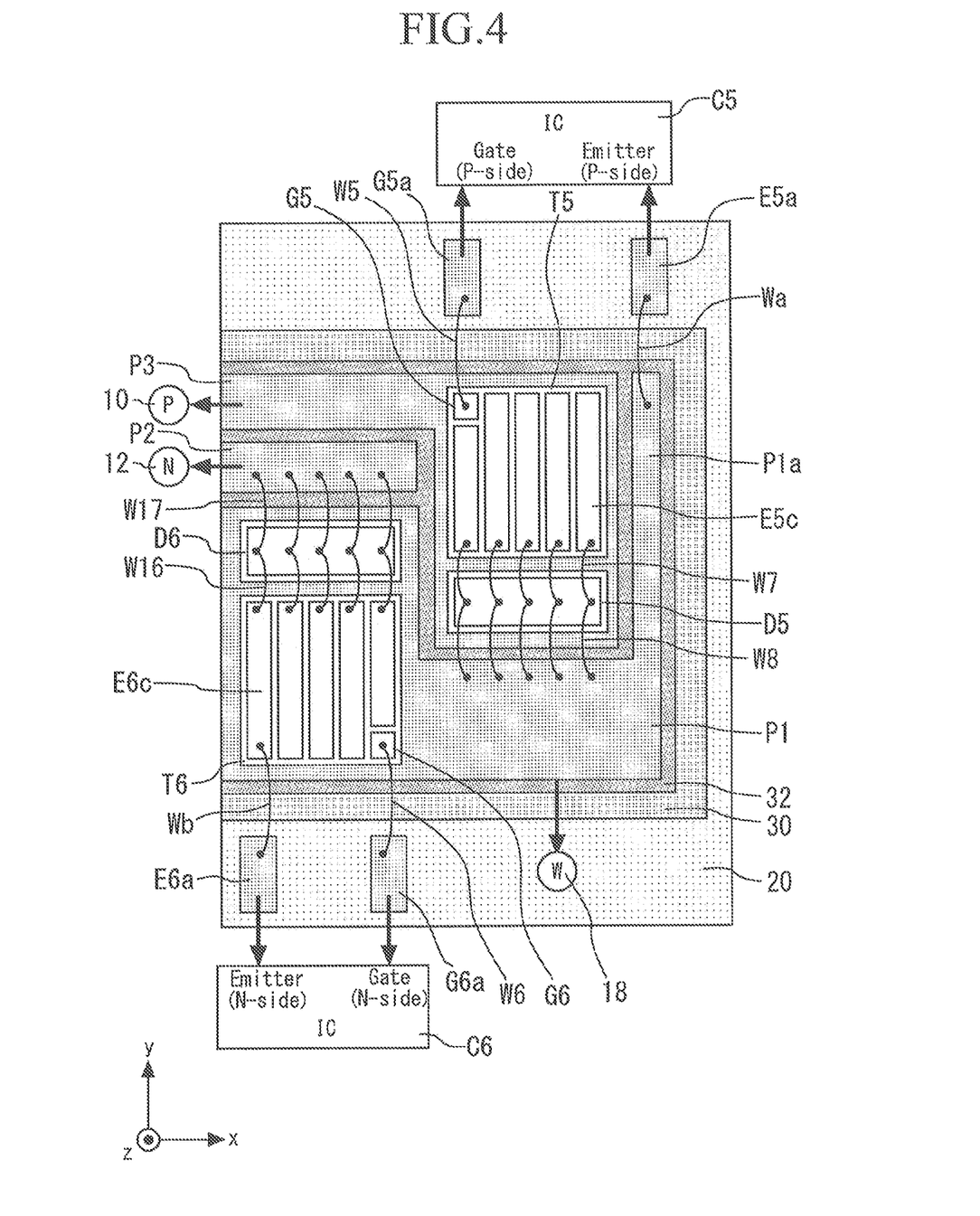
FIG. 4 is a partial plan view of a semiconductor device according to a comparative example.

FIG. 4 is a partial plan view of a semiconductor device according to a comparative example to make it easy to describe the features of the semiconductor device according to the first embodiment. A wire Wa connected to an emitter terminal E5a is connected to a circuit pattern P1 of an insulating substrate. The circuit pattern P1 of FIG. 4 is configured to be larger in size than the circuit pattern P1 of FIG. 3 by only the amount corresponding to provision of a circuit pattern P1a for connecting the wire Wa. The provision of the circuit pattern P1a disturbs miniaturization of the module.

On the other hand, in the semiconductor device according to the first embodiment, since the first emitter wire E5 is directly connected to the first emitter pad E55, the circuit pattern P1a described above is unnecessary. Therefore, the semiconductor device according to the first embodiment is suitable for miniaturization. The first emitter wire E5 may be directly connected to any one pad out of the plural first emitter pads. The first emitter pad to which the first emitter wire E5 is directly connected is referred to as a "first extraction pad". The first extraction pad may be any one of the first emitter pads E51, E52, E53, E54 and E55. With respect to the first semiconductor switching element T5, it may be said that the first emitter pad E51 is the starting end of an emitter current path, and the first emitter pad E55 is the termination of the emitter current path. Therefore, when the first emitter pad E51 is set as the first extraction pad, a relatively small inductance is provided to the first controller C5, so that the effect of reducing the ground potential of the first controller C5 becomes smaller. On the other hand, when the first emitter pad E55 is set as the first extraction pad, a relatively large inductance is provided to the first controller C5, so that the effect of reducing the ground potential of the first controller C5 becomes larger. Any first emitter pad can be set as the first extraction pad in consideration of the above point.

In the case of the semiconductor device of FIG. 3, since the first output wire W7 is directly connected to the first emitter pad E55 as the first extraction pad, the ground potential of the first controller C5 can be sufficiently reduced when current is made to flow through the element. In this case, the first extraction pad is located at the end of the plural first emitter pads.

As described above, the ground wires of the second controllers C2, C4 and C6 are common to one another. In this case, there is a risk that the ground potentials of the second controllers C2, C4 and C6 decrease excessively due to induced electromotive force obtained by the second emitter wires E2, E4 and E6. When the ground potentials of the second controllers C2, C4 and C6 decrease excessively, the energization capability of the second semiconductor switching elements T2, T4 and T6 is excessively suppressed.

Therefore, in the first embodiment, the second emitter pads E61, E62, E63, E64 and E65 are provided to the second semiconductor switching element T6, and wired so that an emitter current flows through these second emitter pads in this order. That is, it may be said that the second emitter pad E61 is the starting end of the emitter current path, and the second emitter pad E65 is the termination of the emitter current path. A pad farthest in electrical distance from a pad connected to the second output wire W16 among the plural second emitter pads is called a "starting end second emitter pad". In FIG. 3, the second emitter pad E61 is the starting end second emitter pad.

Here, the second emitter pad to which the second emitter wire E6 is directly connected is referred to as "second extraction pad". When the second emitter pad E61 is set as the second extraction pad, a relatively small inductance is provided to the second controller C6, so that the effect of reducing the ground potential of the second controller C6 becomes smaller. That is, the ground potential of the second controller C6 can be prevented from excessively decreasing. Taking this point into consideration, it is preferable that the starting end second emitter pad be selected as the second emitter pad for providing the minimum inductance, that is, the second emitter pad E61 be selected as the second extraction pad. That is, the second emitter wire E6 is directly connected to the starting end of the emitter current path. FIG. 3 shows that the second emitter wire E6 is directly connected to the second emitter pad E61 as the starting end second emitter pad, and connected to the second controller C6.

The feature of the W phase described above can be also adopted for the U phase and the V phase. That is, it is preferable that the configuration of the U phase which includes the first semiconductor switching element T1, the second semiconductor switching element T2, the first controller C1 and the second controller C2 is made coincident with the configuration of the W phase described above, and the configuration of the V phase which includes the first semiconductor switching element T3, the second semiconductor switching element T4, the first controller C3 and the second controller C4 is made coincident with the configuration of the W phase described above.

The second emitter pad E61 which is the starting end second emitter pad is located at the end of the plural second emitter pads. The ground potential of the second controller C6 can be suppressed from decreasing excessively by directly connecting the second emitter wire E6 to the second emitter pad E61 to give the ground potential of the second controller C6.

Even when the three-phase AC inverter is not configured, there is a case where an "additive inverter" having the same configuration as the first semiconductor switching element T5 and the second semiconductor switching element T6 is provided, and the second emitter wire E6 and the second emitter wire of the additive inverter are connected to each other. When a common wire is used as the ground wires of the control circuits of the lower arms, the foregoing configuration is effective.

Various modifications can be performed on the semiconductor device according to the first embodiment to the extent that the feature thereof is not lost. For example, in the first embodiment, the longitudinal direction of the first emitter pads E51, E52, E53, E54 and E55 are orthogonal to the first emitter wire E5. However, the first embodiment may adopt another style. Furthermore, when plural first emitter pads are provided, adjacent first emitter pads of the plural first emitter pads are connected to each other via a first wire, and a first output wire is connected to one of the first emitter pads, a starting end side and a termination side for an emitter current can be defined. Under this condition, any one first emitter pad out of the plural first emitter pads may be set as a first extraction pad depending on the degree of inductance which determines the ground potential of the first controller. The same modification can be performed on the configuration on the lower arm side.

The modification described in the first embodiment may be applied to semiconductor devices according to the following embodiments. The semiconductor devices according to the following embodiments will be described while concentrating on the differences from the first embodiment because there are lots of common points to the first embodiment.

Second Embodiment

Figure 5:
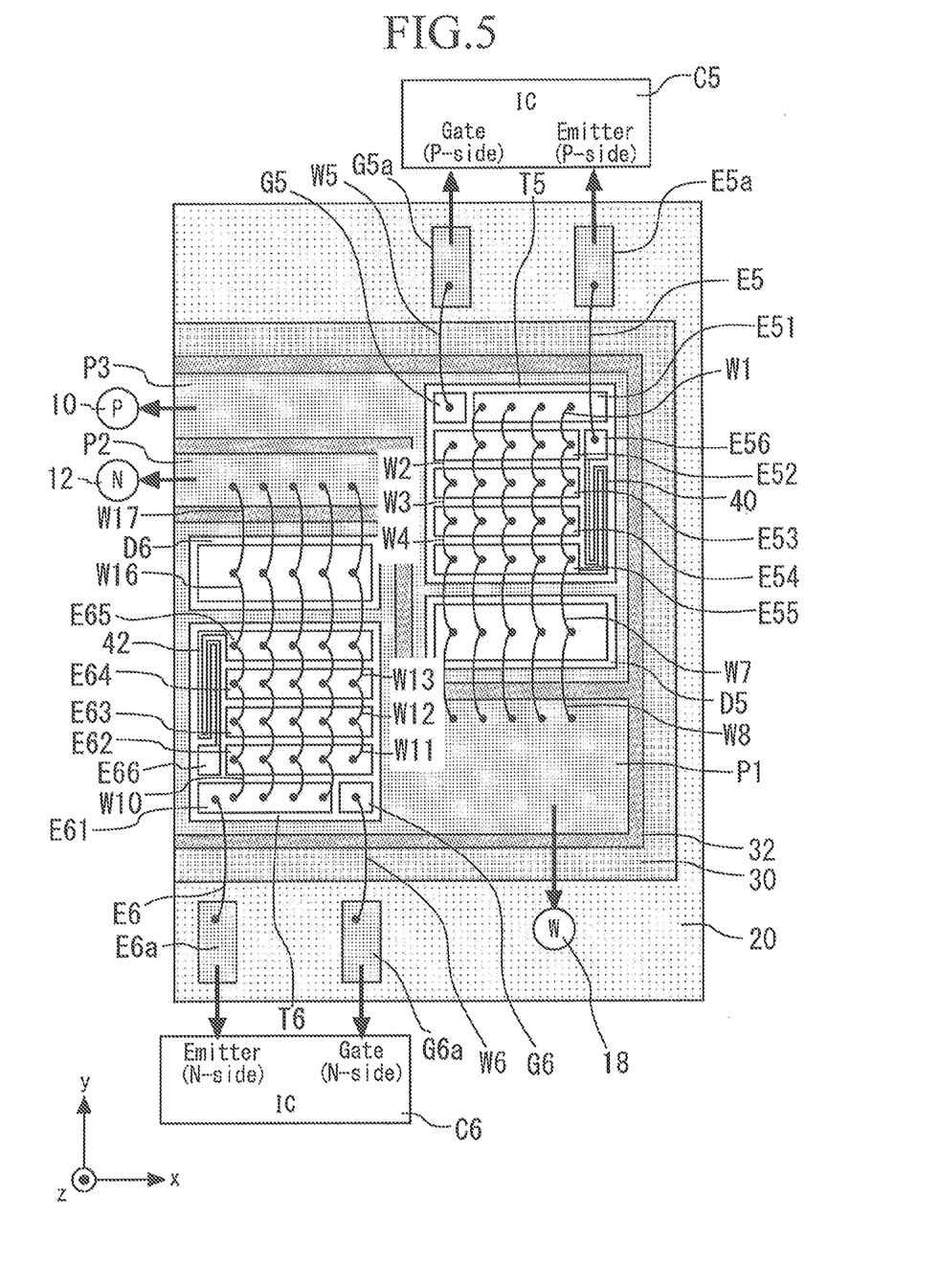
FIG. 5 is a partial plan view of a semiconductor device according to a second embodiment.

FIG. 5 is a partial plan view of a semiconductor device according to a second embodiment. A first semiconductor switching element T5 is provided with a metal pattern 40. The metal pattern 40 is provided on the upper surface of the first semiconductor switching element T5. In addition to the metal pattern 40, first emitter pads E51, E52, E53, E54, E55 and E56 and a first gate pad G5 are provided on the upper surface of the first semiconductor switching element T5. The metal pattern 40 is a wire pattern narrower than the first emitter pads E51, E52, E53, E54, E55 and E56.

The first emitter wire E5 is directly connected to the first emitter pad E56. Accordingly, the first emitter pad E56 is set as a first extraction pad. The first extraction pad and the first emitter pad E55 are connected to each other via the metal pattern 40. The metal pattern 40 functions as an emitter wire extension portion. That is, larger inductance can be provided to the first controller C5 by the metal pattern 40 as compared with a case where the metal pattern 40 is absent. High induced electromotive force can be generated by increasing the inductance component of the P-side emitter wire, so that the effect of suppressing the energization capability of the first semiconductor switching element T5 can be enhanced.

The metal pattern 40 may be connected to the first extraction pad and any one of the first emitter pads E51, E52, E53 and E54. That is, the first extraction pad and a first non-extraction pad which is a pad other than the first extraction pad out of the first emitter pads E51, E52, E53, E54, E55 and E56 may be connected to each other via the metal pattern. Any one of the first emitter pads E51, E52, E53, E54 and E55 may be selected as the first non-extraction pad. Which pad is selected as the first non-extraction pad is determined depending on the magnitude of the inductance to be provided to the first controller C5.

In FIG. 5, the first emitter pad E55 is selected as the first non-extraction pad to which the metal pattern 40 is to be connected. Then, a first output wire W7 is directly connected to the first emitter pad E55. Accordingly, this means that the termination side of the emitter current in the first semiconductor switching element T5 is selected as the first non-extraction pad. This configuration enables the ground potential of the first controller C5 to decrease more greatly as compared with a case where any one of the first emitter pads E51, E52, E53 and E54 is selected as the first non-extraction pad to which the metal pattern 40 is to be connected.

A second semiconductor switching element T6 may be configured to have the same specification as the first semiconductor switching element T5. As a result, the specifications of the semiconductor switching elements in the power module can be integrated with one another, and thus manufacturing and management can be facilitated. However, as described in the first embodiment, since it is preferable to reduce the decrease amount of the ground potential of the second controller, the second emitter wire E6 is normally directly connected to the second emitter pad E61 on the starting end side of the emitter current of the second semiconductor switching element T6. In this case, the metal pattern 42 does not increase the inductance component of the wire of the second controller C6. Accordingly, an element having no metal pattern may be adopted as the second semiconductor switching element.

Third Embodiment

Figure 6:
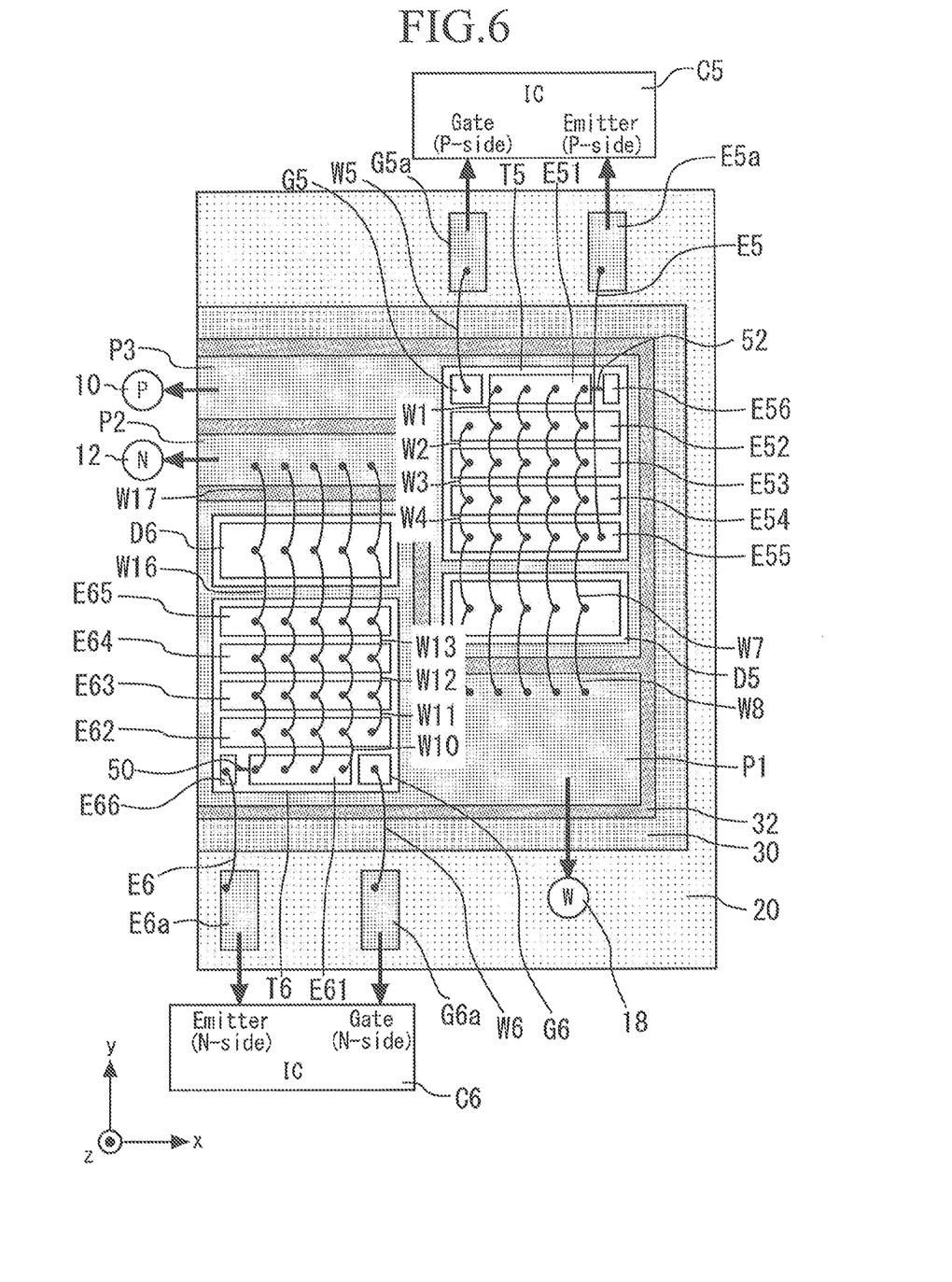
FIG. 6 is a partial plan view of a semiconductor device according to a third embodiment.

FIG. 6 is a partial plan view of a semiconductor device according to a third embodiment. As described above, when current flows in the second semiconductor switching element T6, it is necessary to prevent excessive decrease of the ground potential of the second controller C6. Therefore, in the semiconductor device of the third embodiment, the second semiconductor switching element T6 is provided with an emitter resistor 50. The emitter resistor 50 is provided on the upper surface of the second semiconductor switching element T6. Any well-known material and structure may be adopted for the emitter resistor 50. For example, a carbon coating may be used as a resistance body or a metal coating such as nickel-chrome alloy may be used as a resistance body. The emitter resistor 50 is formed of a material different from the circuit pattern, and it does not serve as a parasitic resistor.

The emitter current is provided to the second controller C2 via the emitter resistor 50. Specifically, the second emitter pad E61 and the second emitter pad E66 as the extraction pad to which the second emitter wire E6 is directly connected are connected to each other via the emitter resistor 50. Current passing through wires of the other phases of the N side is suppressed by the emitter resistor 50. That is, current is provided to the second controller C6 from the second semiconductor switching element of the U phase or V phase, whereby the ground potential of the second controller C6 can be prevented from excessively decreasing. As described above, it is possible to normally perform energization on the power semiconductor switching element of the N side by providing the emitter resistor 50.

One end of the emitter resistor 50 is connected to the second emitter pad E66 which is the extraction pad. The other end of the emitter resistor 50 may be connected to the non-extraction pad which is a pad other than the extraction pad out of the plural second emitter pads. In the semiconductor device of FIG. 6, the second emitter pad E61 is selected as the non-extraction pad. It is preferable to select, as the non-extraction pad, the second emitter pad E61 farthest in electrical distance from a pad connected to the second output wire W16 among the second emitter pads E61, E62, E63, E64 and E65. As a result, the emitter current to be provided to the second controller C6 is reduced, so that the ground potential of the second controller C6 can be prevented from decreasing excessively.

The first semiconductor switching element T5 which is a semiconductor switching element of the P side is configured based on the same specification as the second semiconductor switching element T6. As a result, the specifications of the semiconductor switching elements in the power module are integrated with one another, and manufacturing and management can be facilitated. However, as described in the first embodiment, since it is preferable to increase the decrease amount of the ground potential of the first controller, the first emitter wire E5 is normally connected to the first emitter pad E55 on the termination side of the emitter current of the first semiconductor switching element T5. In this case, it has no effect to provide the emitter resistor 52 and the first emitter pad E56 to the first semiconductor switching element T5. Accordingly, an element having no emitter resistor may be adopted as the first semiconductor switching element T5.

Figure 7:
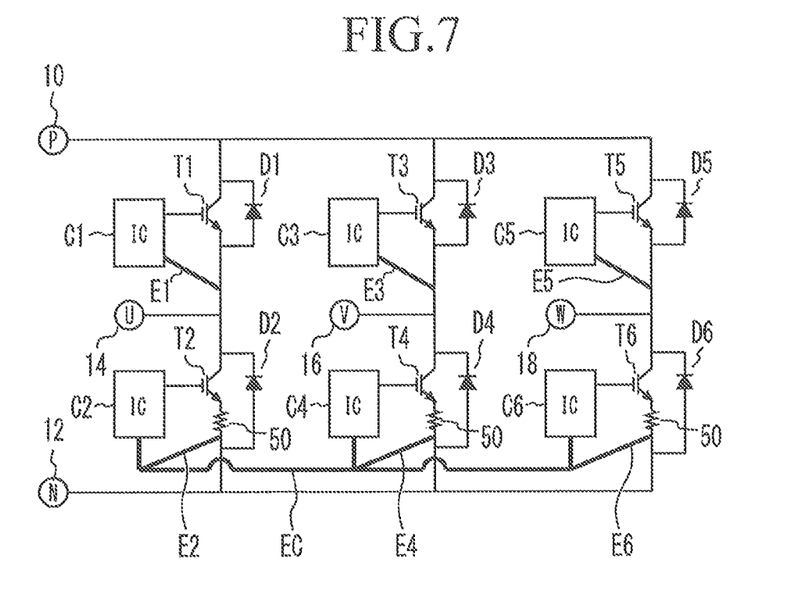
FIG. 7 is a circuit diagram of a semiconductor device according to a third embodiment.

FIG. 7 is a circuit diagram showing a semiconductor device provided with emitter resistors 50. The emitter resistor 50 is provided in the emitter pad of each of the second semiconductor switching elements T2, T4 and T6. In FIG. 7, the emitter resistors of the first semiconductor switching elements T1, T3 and T5 are omitted.

Figure 8:
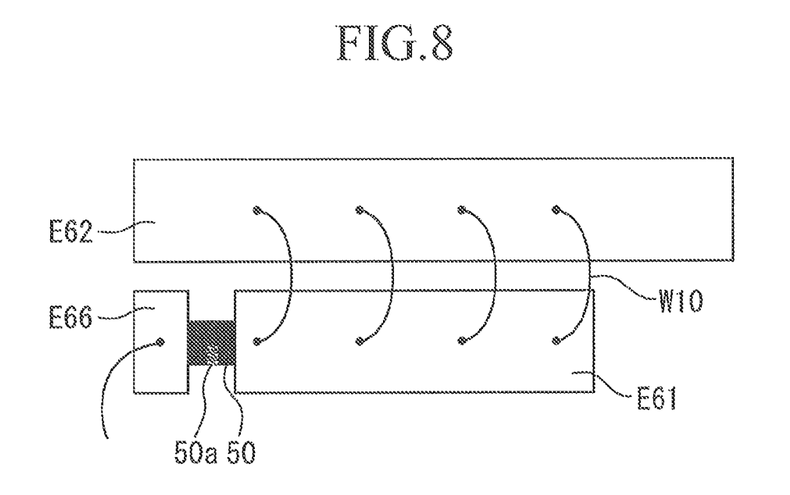
FIG. 8 is a plan view of the emitter resistor according to a modification.

FIG. 8 is a plan view of the emitter resistor according to a modification. An insulating portion 50a is provided to a part of the emitter resistor 50. The insulating portion 50a is a portion formed by laser trimming. The laser trimming cuts a resistance body with a laser while measuring the resistance of the resistance body, thereby obtaining a target resistance value and also reducing the variation of the resistance. An emitter resistor having a resistance value lower than a target resistance value to be realized with the emitter resistor is first formed in advance, and then an insulating portion is formed by laser trimming to narrow a current path, whereby the resistance value can be increased. The laser trimming is stopped at the time when the resistance value reaches the target resistance value, whereby an emitter resistor 50 having a predetermined resistance value can be provided. The emitter resistance value can be adjusted by trimming the emitter resistor 50. As a result, manufacturing variations of the emitter resistor 50 can be eliminated. The emitter resistance may be adjusted by another method.

The second wires W10, W11, W12 and W13 shown in FIG. 6 are used as wires for connecting the adjacent pads out of the plural second emitter pads. The second controller C6 which is a control IC as a controller for applying the gate voltage to the second gate pad G6 is used. Any configuration for outputting the gate voltage may be adopted as the controller, and the controller is not limited to the configuration of IC. The function of the controller may be realized by hardware or software. The second emitter pad E66 which is the extraction pad to which the emitter wire is directly connected may be connected to a second emitter pad other than the second emitter pad E61 via the emitter resistor 50.

Fourth Embodiment

Figure 9:
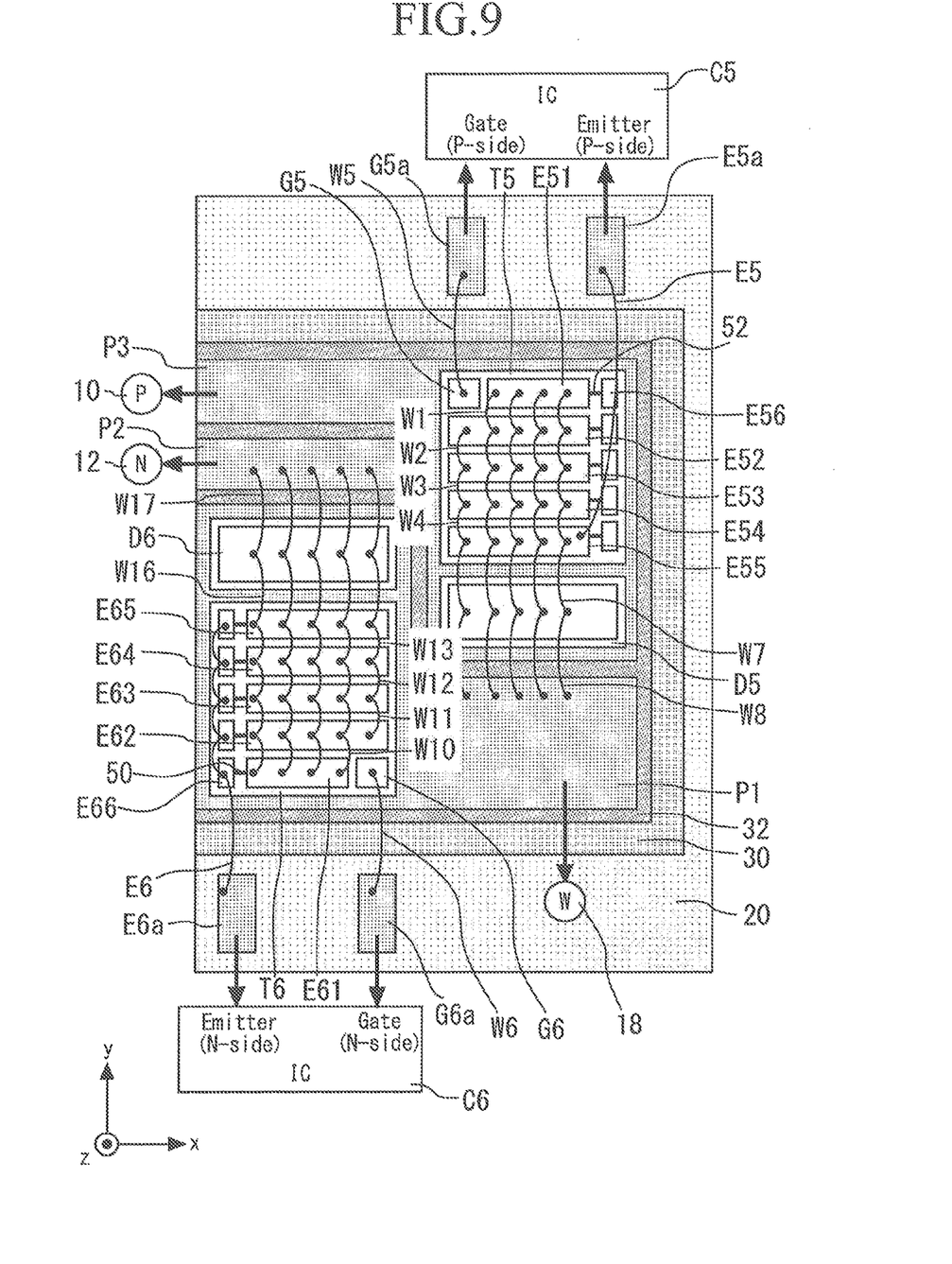
FIG. 9 is a partial plan view of a semiconductor device according to a fourth embodiment.

FIG. 9 is a partial plan view of a semiconductor device according to a fourth embodiment. This semiconductor device is similar to the configuration of FIG. 6 in that the emitter resistor 50 is used in the second semiconductor switching element T6. The difference from the configuration of FIG. 6 resides in that the emitter resistor 50 is installed in all the second emitter pads, and pads to be connected are selectable in a wiring process on the N side when a module is fabricated. Specifically, each of the second emitter pads E61, E62, E63, E64 and E65 is connected to the second emitter pad E66 via each emitter resistor 50. That is, the emitter resistor 50 and the second emitter pad E66 are provided to each of the second emitter pads E61, E62, E63, E64 and E65. Accordingly, plural pads which may serve as the emitter resistor 50 and the extraction pad are provided to the second semiconductor switching element T6.

The inductance to be provided to the second controller C6 can be adjusted by selecting, from the plural second emitter pads E66, an extraction pad to which the second emitter wire E7 is to be directly connected. The adjustment of the inductance based on the selection of the extraction pad as described above can eliminate the manufacturing variations of the emitter resistor at lower cost than the adjustment of the inductance based on the trimming described above.

As shown in FIG. 9, the first semiconductor switching element T5 as the semiconductor switching element of the P side can be configured to have the same specification as the second semiconductor switching element T6. The ground potential of the first controller C5 can be more greatly reduced, not by directly connecting the first emitter wire E5 to any one of the plural first emitter pads E56, but by directly connecting the first emitter wire E5 to the first emitter pad E55. The features of the semiconductor devices according to the respective embodiments described above may be appropriately combined and used.

According to the present invention, the semiconductor switching element may be prevented from being damaged without any trouble by adjusting inductance to be provided to a controller.

The invention claimed is:

1. A semiconductor device comprising:
    a first semiconductor switching element including a first gate pad, a plurality of first emitter pads, and a first collector pad;
    a first wire for connecting adjacent pads out of the plurality of first emitter pads;
    a first output wire for connecting one of the plurality of first emitter pads to an output;
    a first controller for applying a gate voltage to the first gate pad;
    a first emitter wire that is directly connected to a first extraction pad which is any one pad of the plurality of first emitter pads, and is directly connected to an emitter terminal attached to a case to give a ground potential of the first controller; and
    a second semiconductor switching element including a second gate pad, a second emitter pad and a second collector pad connected to the output.

2. The semiconductor device according to claim 1, wherein the first output wire is directly connected to the first extraction pad.

3. The semiconductor device according to claim 2, wherein the plurality of first emitter pads are provided so that long sides of slender pads are adjacent to each other, and the first extraction pad is located at an end of the plurality of first emitter pads.

4. The semiconductor device according to claim 1, wherein the second emitter pad of the second semiconductor switching element includes a plurality of second emitter pads, and the semiconductor device includes a second wire for connecting adjacent pads out of the plurality of second emitter pads, a second output wire which is connected to one pad of the plurality of second emitter pads and makes an emitter current of the second semiconductor switching element flow to an outside of the second semiconductor switching element, a second controller for applying a gate voltage to the second gate pad, and a second emitter wire that is directly connected to a starting end second emitter pad which is a pad farthest in electrical distance from a pad connected to the second output wire among the plurality of second emitter pads, and connected to the second controller, and the second emitter wire gives a ground potential of the second controller.

5. The semiconductor device according to claim 4, wherein the plurality of second emitter pads are shaped so that long sides of slender pads are adjacent to one another, and the starting end second emitter pad is located at an end of the plurality of second emitter pads.

6. The semiconductor device according to claim 1, wherein the first collector pad is connected to a high-voltage side of a power source, and the second emitter pad is connected to a low-voltage side of the power source.

7. The semiconductor device according to claim 4, further comprising an additive inverter having the same configuration as the first semiconductor switching element and the second semiconductor switching element, wherein a second emitter wire of the additive inverter is connected to the second emitter wire.

8. The semiconductor device according to claim 1, further comprising a metal pattern provided to the first semiconductor switching element, wherein the first extraction pad and a first non-extraction pad which is a pad other than the first extraction pad out of the plurality of first emitter pads are connected to each other via the metal pattern.

9. The semiconductor device according to claim 8, wherein the first output wire is directly connected to the first non-extraction pad.

10. The semiconductor device according to claim 8, wherein the second semiconductor switching element is configured to have the same specification as the first semiconductor switching element.

11. The semiconductor device according to claim 1, wherein each of the first semiconductor switching element and the second semiconductor switching element is a MOSFET formed of SiC as a material thereof, or an IGBT formed of SiC as a material thereof.

12. A semiconductor device comprising:
    a first semiconductor switching element including a first gate pad, a first emitter pad connected to an output, and a first collector pad;
    a second semiconductor switching element including a second gate pad, a plurality of second emitter pads, an emitter resistor and a second collector pad connected to the output;
    a wire for connecting adjacent pads out of the plurality of second emitter pads;
    a second output wire that is connected to one pad out of the plurality of second emitter pads, and makes an emitter current of the second semiconductor switching element flow to an outside of the second semiconductor switching element;
    a controller for applying a gate voltage to the second gate pad; and
    an emitter wire that is directly connected to a extraction pad which is any one pad out of the plurality second emitter pads, and connected to the controller to give a ground potential of the controller, wherein the extraction pad and a non-extraction pad which is a pad other than the extraction pad out of the plurality of second emitter pads are connected to each other via the emitter resistor.

13. The semiconductor device according to claim 12, wherein the non-extraction pad is a pad farthest in electrical distance from a pad connected to the second output wire among the plurality of second emitter pads.

14. The semiconductor device according to claim 12, wherein a part of the emitter resistor contains an insulating portion.

15. The semiconductor device according to claim 12, wherein the emitter resistor includes a plurality of emitter resistors and the extraction pad includes a plurality of extraction pads.

* * * * *